United States Patent [19]

Brooks et al.

[11] Patent Number: 5,770,479
[45] Date of Patent: Jun. 23, 1998

[54] BONDING SUPPORT FOR LEADS-OVER-CHIP PROCESS

[75] Inventors: Mike Brooks, Caldwell; Alan G. Wood, Boise, both of Id.

[73] Assignee: Micron Technology, Inc., Boise, Id.

[21] Appl. No.: 584,672

[22] Filed: Jan. 11, 1996

[51] Int. Cl.⁶ .................................................. H01L 21/60
[52] U.S. Cl. ........................ 438/123; 438/111; 438/122; 438/124
[58] Field of Search ................................... 438/111, 112, 438/118, 122, 123, 124

[56] References Cited

U.S. PATENT DOCUMENTS

| | | | |
|---|---|---|---|
| 4,716,124 | 12/1987 | Yerman et al. | 438/111 |
| 4,862,245 | 8/1989 | Pashby et al. . | |
| 4,984,059 | 1/1991 | Kubota et al. | 357/68 |
| 5,107,328 | 4/1992 | Kinsman | 357/74 |
| 5,140,404 | 8/1992 | Fogal et al. | 357/70 |
| 5,177,032 | 1/1993 | Fogal et al. | 437/220 |
| 5,198,883 | 3/1993 | Takahashi et al. | 257/676 |
| 5,231,755 | 8/1993 | Emanuel | 29/827 |
| 5,256,598 | 10/1993 | Farnworth et al. | 437/220 |
| 5,286,679 | 2/1994 | Farnworth et al. | 437/209 |
| 5,304,842 | 4/1994 | Farnworth et al. | 257/668 |
| 5,321,204 | 6/1994 | Ko | 257/676 |
| 5,334,803 | 8/1994 | Yamamura et al. | 257/676 |
| 5,336,649 | 8/1994 | Kinsman et al. | 438/118 |
| 5,387,554 | 2/1995 | Liang | 438/122 |
| 5,409,866 | 4/1995 | Sato et al. | 438/123 |
| 5,420,752 | 5/1995 | Variot | 438/122 |

OTHER PUBLICATIONS

Tech Spray, Inc. Sales Brochure, Feb., 1994.

*Primary Examiner*—Kevin Picardat

[57] ABSTRACT

A method of forming a semiconductor memory device comprises the steps of providing a semiconductor die, forming a temporary protective material over a surface of the die, and attaching the die to a first lead frame portion. Next, a protective material is contacted with a second lead frame portion and, subsequently, the second lead frame portion is electrically connected with the second lead frame portion with bond pads on the first surface of the die with bond wires. Subsequent to electrically connecting the die and the second lead frame portion the protective material is removed.

24 Claims, 3 Drawing Sheets

BONDING SUPPORT FOR LEADS-OVER-CHIP PROCESS

FIELD OF THE INVENTION

This invention relates to the field of semiconductor manufacture, and more particularly to a semiconductor assembly having a lead frame or a similar support.

BACKGROUND OF THE INVENTION

To manufacture a leads-over-chip (LOC) semiconductor device such as a memory device, a microprocessor, or logic device, a front circuit side of a semiconductor die is attached to a lead frame using various adhesives such as double sided tape. Various LOC and backside attach designs are described in U.S. Pat. Nos. 5,140,404; 5,177,032; 5,256,598; 5,304, 842, each assigned to Micron Technology, Inc. and U.S. Pat. No. 4,862,245 assigned to International Business Machines Corp. A ceramic LOC assembly is described in U.S. Pat. No. 5,107,328, also assigned to Micron Technology, Inc. Each of these patents is incorporated herein by reference.

To successfully manufacture a semiconductor device having an LOC design, thermal coefficients of expansion (TCE) of the die, the lead frame, and the attach material must closely match. A TCE mismatch between the three components can damage the die if there is a thermal mismatch between the attach material and the die, or can cause the die to separate from the lead frame if there is a TCE mismatch between the attach material and the lead frame.

A semiconductor assembly which reduces problems associated with thermal mismatch would be advantageous.

SUMMARY OF THE INVENTION

One embodiment of an inventive method for forming a semiconductor assembly comprises the steps of forming a protective material over a semiconductor wafer section, then contacting a lead frame with the protective material. Subsequent to contacting the wafer section and the protective material, the protective material can be removed from the wafer section.

Objects and advantages will become apparent to those skilled in the art from the following detailed description read in conjunction with the appended claims and the attached drawings.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
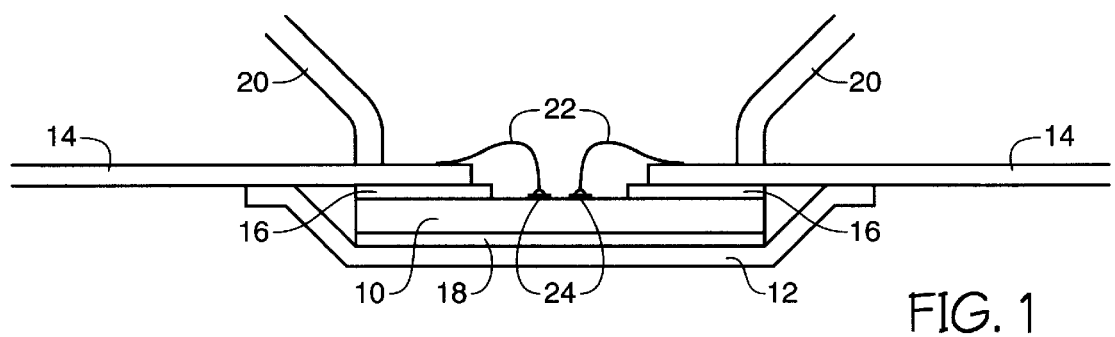
FIGS. 1 and 2 are cross sections depicting intermediate assemblies resulting from a first embodiment of the inventive process.

FIG. 1 depicts a semiconductor wafer section 10, such as a die or a plurality of singularized or unsingularized die from a semiconductor wafer, supported by a first lead frame portion 12 connected to a second lead frame portion 14. The first and second lead frame portions can be a metal such as a copper alloy, in which case the two portions can be welded or brazed, adhered with adhesive, or connected in any workable manner. The first lead frame portion may also be a nonconductive material such as plastic or polymer, in which case the two portions can be adhered with adhesive, connected in a manner described later herein, or connected by other workable means. A combination of polymer and metal can also be used for the first lead frame portion. The wafer section 10 has formed thereover a protective material 16, for example a protective material which can be removed at later processing steps. An attach material 18 connects the wafer section 10 with the first lead frame portion 12. Wire bond clamps 20 urge lead portions such as lead fingers (the lead portion electrically connected to the die) of the second lead frame portion 14 against the protective material which mechanically connects the wafer section 10 with the second lead frame portion. A wire bonder (not shown) attaches bond wires 22 to electrically connect bond pads 24 on the wafer section 10 with the second lead frame portion 14, and possibly with 12.

An embodiment of an inventive method for forming the semiconductor assembly described above comprises forming the protective material 16 over the wafer section 10. Forming the protective material 16 is most efficiently accomplished before a wafer from which the wafer section originates has been sliced into a plurality of wafer sections, although the protective material could conceivably be formed after singularization of the individual wafer sections. The protective material can be applied by screen printing or stenciling the protective material on the wafer or by a wafer fabrication deposition and photographic imaging process. Similarly, a photoresist material such as a water- or solvent-soluble photoresist applied by means known in the art may function adequately as a protective material, and other sufficient materials and processes are likely. Some protective materials may require a curing step.

After the protective material is formed over (or affixed to) the wafer, the bond pads 24 are exposed, for example with a vertical etch. This etch can be done during conventional wafer processing, for example during an etch to remove a passivation layer from the bond pads before the wafer is singularized. If the protective material is stenciled or screen printed onto the wafer or die, covering the bond pads is avoided during application of the material in which case removal of material over the bond pads would not be necessary.

The wafer section is then attached to the first lead frame portion 12 using an attach material 18. Various attach materials can be used, for example double-sided tape, epoxy, polyimide, silicone elastomer, or other materials known in the art. The first lead frame portion 12 is then connected to the second lead frame portion 14, such as by brazing, spot welding, by using an adhesive, glue, epoxy or a rivet, or by other means. The clamps 20 such as wire bond clamps urge lead fingers of the second lead frame portion 14 to contact the protective material 16. The protective material 16 protects circuitry on the surface of the wafer section from damage from the lead fingers of the second lead frame portion 14. Bond wires 22 are formed by the wire bonder (not shown) to electrically connect the bond pads 24 with the lead fingers of the second lead frame portion 14. However, electrical connection of the lead finger and the bond pad can be made by other means as described later herein or by any workable means.

Figure 2:
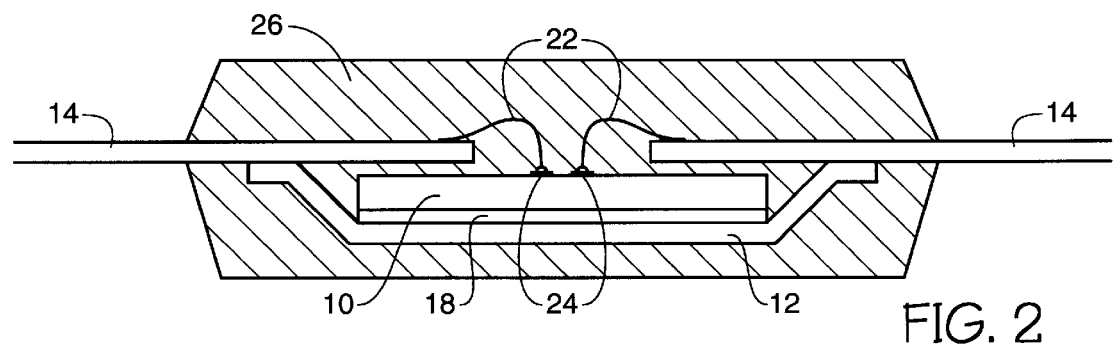

The protective material 16 can be removed from the surface of the die 10 as depicted in FIG. 2. A material such as Wondermask® available from Tech Spray Inc. of Amarillo, Tex. would provide an adequate protection, and is available in water-soluble and other solvent-soluble formulas. By spraying, dipping, or other application of the water or other solvent to the assembly the protective material can be removed. Removal of the protective material may not be necessary. Subsequently, the device is encapsulated 26 or otherwise packaged.

The distance between the lead fingers and the die is determined in this embodiment by the arrangement of the first 12 and second 14 lead frame portions. The protective material 16 prevents damage to the circuitry of the die from the lead fingers as fingers of the second lead frame portion are urged toward the die by wire bond clamps. The main function of material 16 is for protection and not to connect die 10 to second lead frame portion 14. The distance between the die and the second lead frame portion should be a minimum distance to allow encapsulation material to flow between the die 10 and the lead frame 14. Thus with this inventive embodiment the wafer section is mechanically connected to the second lead frame portion 14 by the first lead frame portion 12 and connected electrically to the second lead frame portion by the bond wires 22.

Figure 3:
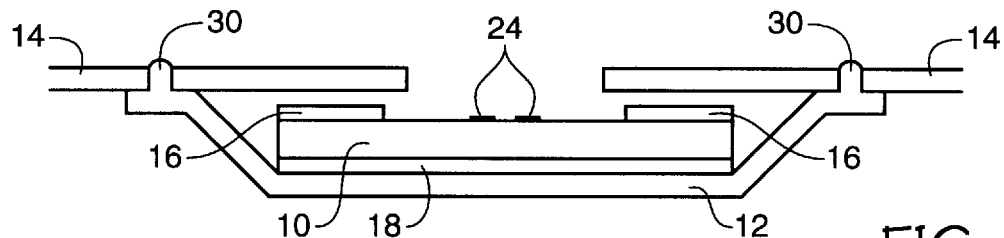
FIG. 3 is a cross section depicting a second inventive embodiment.
Figure 4:
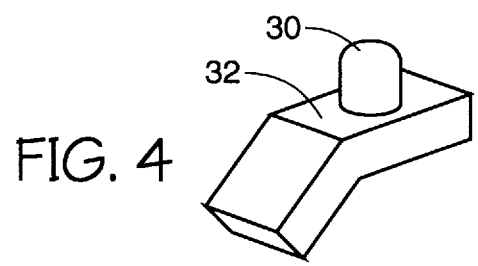
FIG. 4 is an isometric detail view of a portion of the FIG. 3 embodiment.

FIGS. 3 and 4 depict one embodiment for connecting the first lead frame portion 12 to the second lead frame portion 14. With this embodiment, the first lead frame portion comprises a pin 30 (depicted in detail in FIG. 4) which protrudes through a hole or other opening in the second lead frame portion 14. A shoulder 32 on the first lead frame portion contacts the second lead frame portion. The pin protrudes from the hole or opening in the second lead frame portion and is compressed or otherwise flattened (not shown) to form a rivet, thereby attaching the first and second lead frame portions. This attachment means would function sufficiently with a metal first lead frame portion. Other materials may also function adequately, for example plastics, polymers, or a combination of plastics and metals.

FIG. 3 further depicts the lead fingers of the second lead frame portion positioned above the protective material. In a later step, wire bond clamps urge the lead fingers toward the die. The lead fingers then contact the protective material and the bond wires are connected to the bond pads and to the lead fingers. FIG. 3 further depicts the edge of the protective material 16 inset from the edge of the lead fingers, in contrast to the embodiment of FIG. 1. Either arrangement would function adequately.

Figure 5:
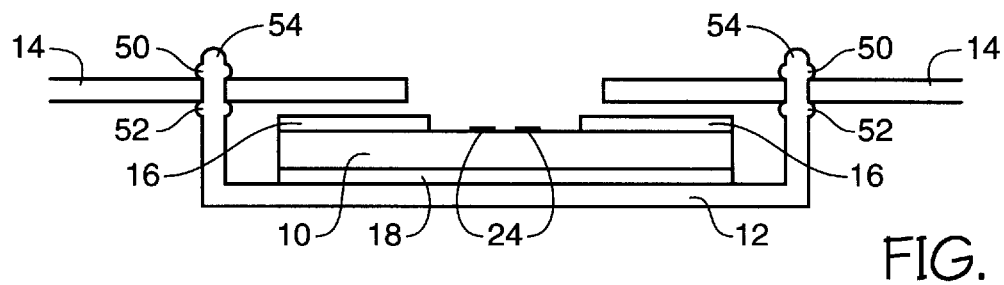
FIG. 5 is a cross section depicting a third inventive embodiment.
Figure 6:
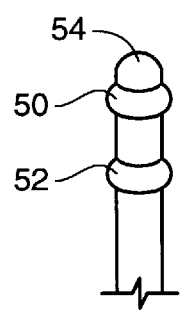
FIG. 6 is an isometric detail view of a portion of the FIG. 5 embodiment.

FIGS. 5 and 6 depict another embodiment for connecting the first and second lead frame portions. This embodiment comprises at least a first raised portion 50, and preferably a second raised portion 52, on the first lead frame portion to attach the first and second lead frame portions. The first raised portion extends through a hole or other opening on the second lead frame portion. A thinner portion 54 above the first raised portion 50 may aid in guiding the first raised portion through the hole in the second lead frame portion.

The second lead frame portion is thereby secured between the first and second raised portions in the first lead frame portion. This embodiment would function most efficiently with a first lead frame portion manufactured from a plastic, polymer, combination of plastic and metal, or similar material, although it may be workable with a metal first lead frame portion as well.

Figure 7:
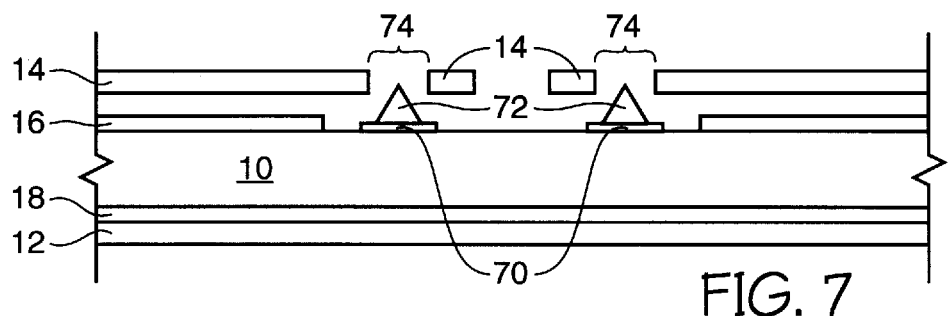
FIG. 7 is a cross section.
Figure 8:
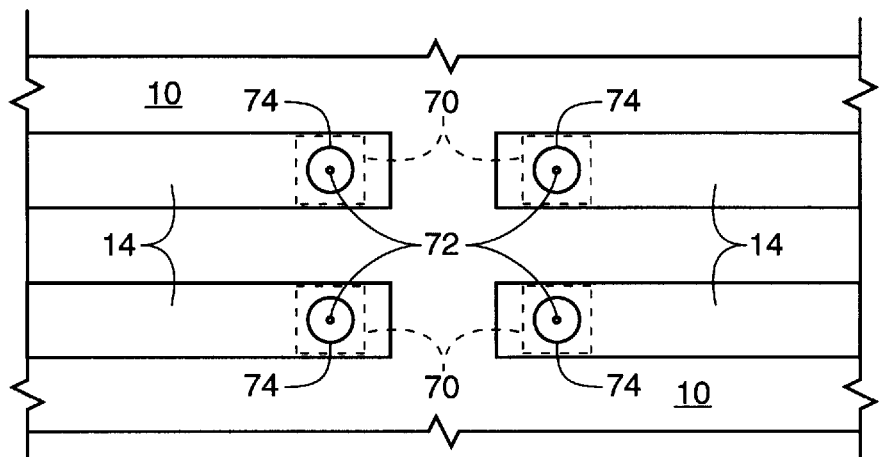
FIG. 8 is a top view, of another inventive embodiment.

FIG. 7 (side view) and FIG. 8 (top view) depict an embodiment of the invention which does not require a first lead frame portion. With this embodiment, the bond pads 70 are manufactured with bumps or other protrusions 72 which extend through holes 74 or other openings in the lead frame 14, depicted in a top view in FIG. 8. The wafer section 10 and lead frame 14 are aligned and brought together so the protrusions 72 extend through the holes 74 in the lead frame. The protrusions, if they extend beyond the top surface of the lead frame 14, can be flattened which may provide an adequate electrical attachment between the lead fingers and the bond pads. More likely, however, the protrusions would be subjected to thermal reflow, or another electrically conductive material such as silver, gold, solder or other alloy, or conductive epoxy would be formed to physically contact the protrusions and/or bond pads and the lead frame to provide an adequate electrical and mechanical attachment. Depending on the materials, a cure step may be required. With this embodiment, the protective material 16 provides a spacer between the die and the lead frame, and prevents the lead frame from shorting circuitry on the die.

Figure 9:
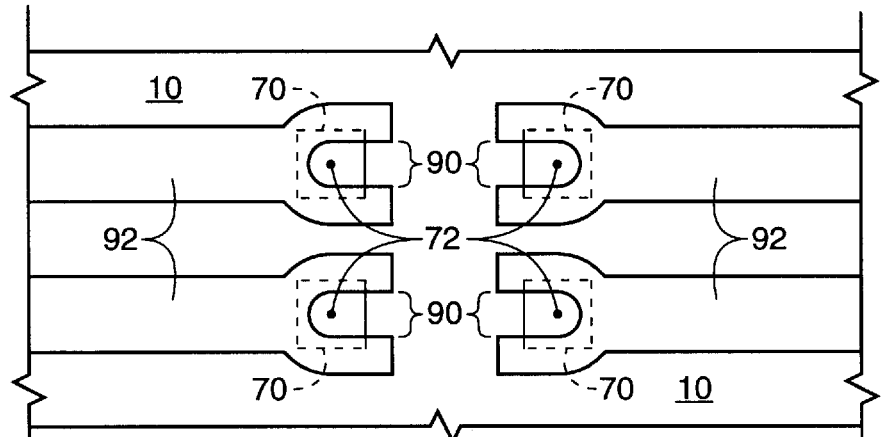
FIG. 9 is a top view of another inventive embodiment.

FIG. 9 depicts a top view of an embodiment similar to that of FIGS. 7 and 8 with an open ended opening 90 in the lead finger 92.

Figure 10:
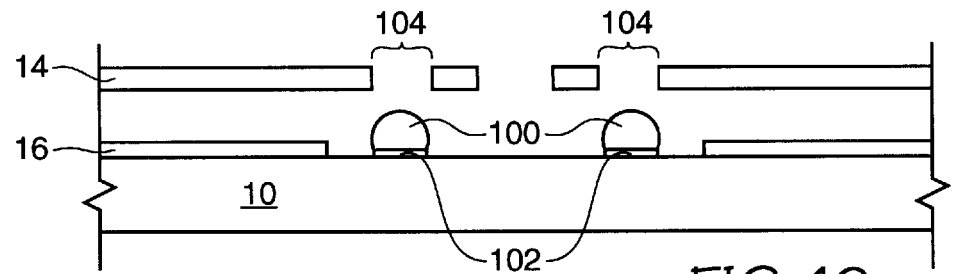
FIG. 10 is a cross section of a further embodiment of the invention.

FIG. 10 is a side view depicting balls 100 of conductive material formed on the bond pads 102. The conductive material can be solder, solder-wettable paste, conductive paste, or other workable materials. With this embodiment, the protective material 16 functions as a spacer between the die 10 and the lead frame 14. The die 10 and lead frame 14 are brought together such that the conductive ball contacts the lead frame, for example in the area of an opening such as a hole 104 in the lead frame. If the conductive ball 102 is not already soft it is softened, for example by heating. The solder ball wicks up to partially or completely fill the hole 104 thereby forming a conductive attachment between the bond pad 102 and the lead finger.

The embodiments depicted in FIGS. 7–10 form a very thin package. Bond wires, which conventionally require a loop, are not required thereby decreasing the thickness of the package, and further a support under the lead frame is not required. Further, the bond wires are known to have associated problems such as movement during encapsulation which is known to result in electrical shorts and opens. The embodiments of FIGS. 7–10 thereby do not have these problems associated with bond wires.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the various embodiments of the invention can be used to attach a semiconductor die or other wafer section to a lead frame other than the LOC style lead frame depicted, various adhesives can be used, and other embodiments of the invention will become apparent to those skilled in the art from reading this description. It is therefore contemplated that the appended claims will cover any such modifications or embodiments as fall within the true scope of the invention.

What is claimed is:

1. A method for forming a semiconductor assembly comprising the following steps:
   a) forming a protective material over a semiconductor wafer section;
   b) contacting a lead frame with said protective material;
   c) subsequent to said contacting step, removing said protective material from said wafer section.

2. The method of claim 1 wherein said protective material is removed by dissolving said protective material.

3. The method of claim 2 wherein said protective material is dissolved with a solvent comprising alcohol.

4. The method of claim 2 wherein said protective material is dissolved with a solvent comprising water.

5. The method of claim 1 wherein said wafer section and at least a portion of said lead frame are encapsulated subsequent to said step of removing said protective material.

6. A method for forming a semiconductor assembly comprising the following steps:
   a) forming a protective material over a circuit side of a wafer section;
   b) attaching a back side of said wafer section to a first lead frame portion;
   c) attaching said first lead frame portion to a second lead frame portion;
   d) contacting a lead section of said second lead frame portion and said protective material, said contact between said lead section and said protective material being substantially nonadhesive.

7. The method of claim 6 further comprising the step of removing said protective material subsequent to said step of contacting said lead sections and said protective material.

8. The method of claim 7 wherein said protective material is removed using water.

9. The method of claim 6 wherein said wafer section is a part of a wafer during said formation of said protective material, further comprising the step of singularizing said wafer into a plurality of wafer sections prior to said step of attaching said wafer section to said first lead frame portion.

10. The method of claim 6 wherein said step of forming said protective layer comprising a curing step.

11. The method of claim 6 further comprising the step of wire bonding pads of said wafer section with said lead section during said step of contacting said lead sections and said protective material.

12. The method of claim 11 wherein said lead section does not contact said protective material subsequent to said wire bonding.

13. A method for forming a semiconductor assembly comprising the following steps:
   a) forming a protective material over a first side of a wafer section;
   b) attaching said wafer section to a first lead frame portion;
   c) attaching a second lead frame portion having at least one opening therein to said first lead frame portion, said first lead frame portion having at least one pin which extends through said opening.

14. The method of claim 13 further comprising the step of contacting a lead section of said second lead frame portion and said protective material, said contact between said lead section and said protective material being substantially nonadhesive.

15. The method of claim 14 further comprising the step of removing said protective material subsequent to said step of contacting said lead sections and said protective material.

16. The method of claim 15 wherein said protective material is removed using water.

17. The method of claim 13 wherein said wafer section is a part of a wafer during said formation of said protective material, further comprising the step of singularizing said wafer into a plurality of wafer sections prior to said step of attaching said wafer section to said first lead frame portion.

18. The method of claim 13 wherein said first lead frame portion is nonconductive and said second lead frame portion is conductive.

19. The method of claim 18 wherein said first lead frame portion is plastic and said second lead frame portion comprises metal.

20. The method of claim 13 wherein said opening is a slot in said second lead frame portion.

21. The method of claim 13 wherein said opening is a hole in said second lead frame portion.

22. A method for forming a semiconductor assembly comprising the following steps:
   a) forming a protective material over a semiconductor wafer section, said wafer section having a plurality of pads;
   b) forming an attachment material on at least one of said pads;
   c) contacting said protective material with said wafer section, said contact between said lead frame and said protective material being substantially nonadhesive;
   d) connecting a lead frame to said wafer section with said attachment material.

23. The method of claim 22 wherein said attachment material provides, at least temporarily, a sole mechanical attachment between said wafer section and said lead frame.

24. The method of claim 23 wherein said pads are bond pads and wherein said attachment material is conductive.

* * * * *